(12) United States Patent
Cheng et al.

(10) Patent No.: US 8,349,713 B2
(45) Date of Patent: Jan. 8, 2013

(54) HIGH SPEED LASER CRYSTALLIZATION OF PARTICLES OF PHOTOVOLTAIC SOLAR CELLS

(75) Inventors: Gary J. Cheng, West Lafayette, IN (US); Martin Yi Zhang, West Lafayette, IN (US); Yingling Yang, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 13/113,386

(22) Filed: May 23, 2011

(65) Prior Publication Data

US 2012/0021559 A1 Jan. 26, 2012

Related U.S. Application Data

(60) Provisional application No. 61/347,538, filed on May 24, 2010.

(51) Int. Cl.
*H01L 21/20* (2006.01)
(52) U.S. Cl. .................. 438/486; 438/46; 257/E21.134
(58) Field of Classification Search .................. 438/29, 438/31–32, 41, 44–46, 308, 486; 257/E21.133, 257/E31.134
See application file for complete search history.

(56) References Cited

U.S. PATENT DOCUMENTS

2008/0150165 A1 * 6/2008 Stumbo et al. ................ 257/784

* cited by examiner

*Primary Examiner* — Thanhha Pham
(74) *Attorney, Agent, or Firm* — Hartman Global IP Law; Gary M. Hartman; Domenica N. S. Hartman

(57) ABSTRACT

A system and method for enhancing the conversion efficiency of thin film photovoltaics. The thin film structure includes a photovoltaic absorbent layer covered by a confinement layer. A laser beam passes through the confinement layer and hits the photovoltaic absorbent layer. The laser can be pulsed to create localized rapid heating and cooling of the photovoltaic absorbent layer. The confinement layer confines the laser induced plasma plume creating a localized high-pressure condition for the photovoltaic absorbent layer. The laser beam can be scanned across specific regions of the thin film structure. The laser beam can be pulsed as a series of short pulses. The photovoltaic absorbent layer can be made of various materials including copper indium diselenide, gallium arsenide, and cadmium telluride. The photovoltaic absorbent layer can be sandwiched between a substrate and the confinement layer, and a molybdenum layer can be between the substrate and the photovoltaic absorbent layer.

10 Claims, 11 Drawing Sheets

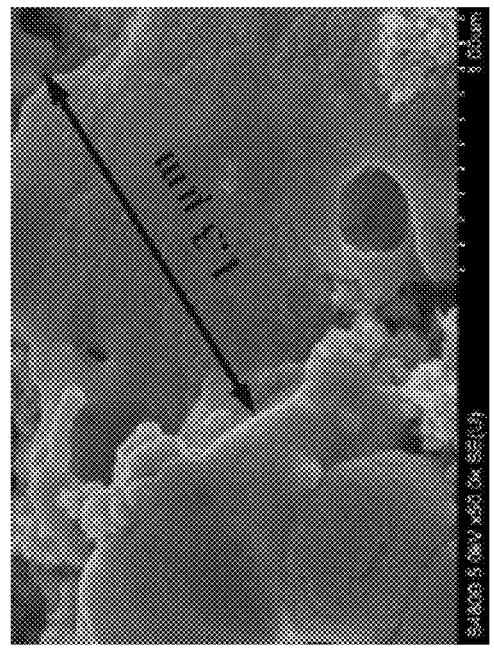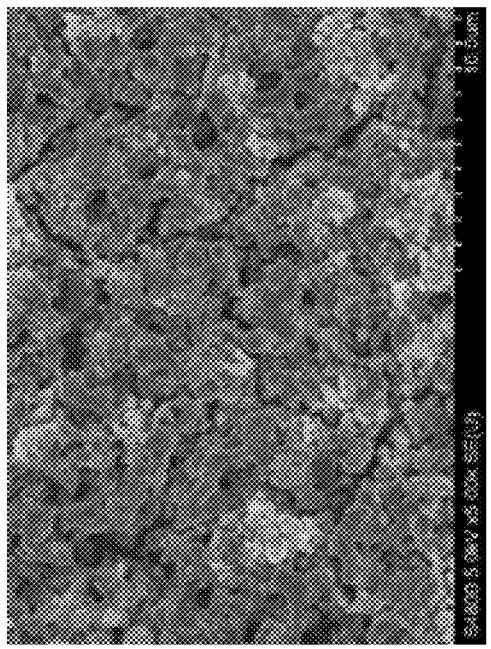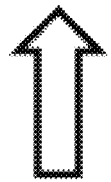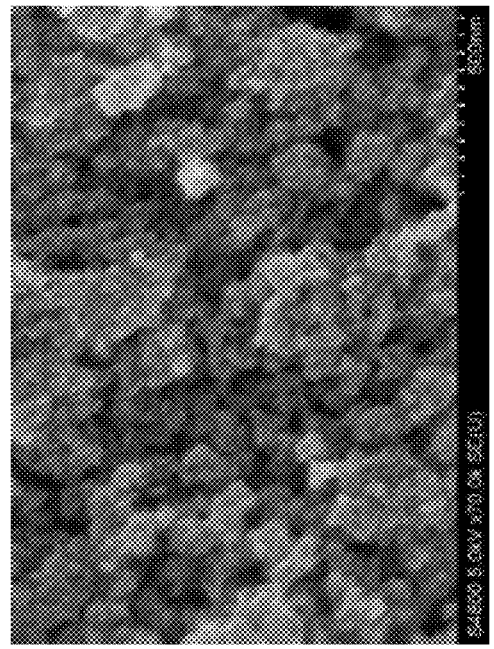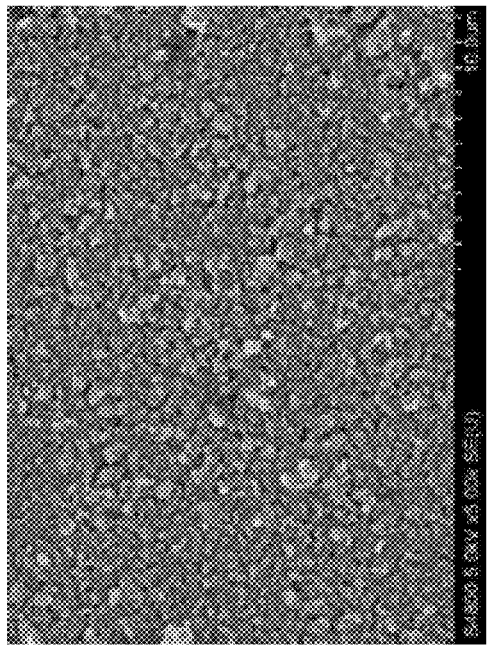
Figure 3B
Figure 3A

HIGH SPEED LASER CRYSTALLIZATION OF PARTICLES OF PHOTOVOLTAIC SOLAR CELLS

CROSS-REFERENCE TO RELATED APPLICATIONS

This application claims the benefit of U.S. Provisional Application Ser. No. 61/347,538, filed on May 24, 2010, entitled "High Speed Laser Crystallization of Particles of Photovoltaic Solar Cells" which is incorporated herein by reference.

BACKGROUND

The present invention generally relates to material processing methods via high speed laser crystallization, and more particularly to methods for enhancing the conversion efficiency of thin film photovoltaics by increasing crystal size and decreasing the defects of the light absorbent layer.

The conversion efficiency of thin film solar cells depends on the crystallinity of the light absorbent layer (e.g., cadmium telluride (CdTE), copper indium selenide (CIS) and copper indium gallium selenide (CIGS)). Defects such as grain boundary and point defects in current thin film photovoltaics (PVs) degrade the photon-electron conversion efficiency and transportation of electrons. Traditional crystallization techniques used in the photovoltaic (PV) industry, such as Rapid Thermal Annealing (RTA) techniques, have several limitations. These limitations can include issues regarding non-selective heating, slow crystal growth, temperature control for large crystal growth, and the need to use costly vacuum/inert gas environments. There is a need for crystallization techniques that overcome one or more of these limitations, for example by being faster, more selective or lower cost. These improved techniques can be used to create large crystals of absorbent materials for high efficiency PVs.

SUMMARY

A low cost and rapid processing method is disclosed for enhancing the conversion efficiency of thin film photovoltaics (PVs) via high speed laser crystallization (HSLC). The disclosed HSLC method provides a low cost and rapid technique for forming large crystals for thin film solar cells. The disclosed laser induced rapid heating/cooling procedure, which selectively processes desired materials without damaging other portions of the part, helps promote rapid growth of nanocrystals into ultra-large crystals. A transparent confinement layer can be used to promote the formation of densely-packed crystals. As those of skill in the art should understand and appreciate, the present techniques can also be applied to other thin film PV absorbent related materials and crystals in broader applications. As such, the present teachings are not intended to be limited to the embodiments discussed herein.

As compared to conventional crystallization techniques, such as rapid thermal annealing (RTA), the disclosed system can include one or more unique and novel advantages. The disclosed system can enable larger crystals to be grown, for example a few microns in size versus less than 1 µm for conventional techniques. The disclosed system can enable faster crystal growth, for example in nanoseconds rather than seconds for conventional techniques. The disclosed system can enable faster production rates, for example mass production rather than single lot sizes. The disclosed system can also enable one or more of selective processing, energy saving production and densification of packed crystals without requiring complicated temperature control systems or sophisticated vacuum/inert gas systems.

A method is disclosed for enhancing the conversion efficiency of thin film photovoltaics where the method comprises obtaining a thin film structure that includes a photovoltaic absorbent layer; transmitting a laser beam along an optical path to hit the photovoltaic absorbent layer; pulsing the laser beam to create a localized rapid heating and cooling of the photovoltaic absorbent layer; and transparently confining the photovoltaic absorbent layer to confine a laser induced plasma plume and create a localized high-pressure condition for the photovoltaic absorbent layer. The method can also include scanning the laser beam across a specific region of the thin film structure. The scanning can be performed by moving the thin film structure using an X-Y stage, and/or by using a movable mirror to scan the laser beam across the thin film structure. The laser beam can be pulsed as a series of laser beam pulses having a duration of approximately 5 nanoseconds. The series of laser beam pulses can include 20 or more pulses.

A system for fabricating thin film photovoltaics is disclosed that includes a thin film structure and a laser. The thin film structure includes a photovoltaic absorbent layer covered by a confinement layer. The laser generates a laser beam that travels along an optical path to hit the photovoltaic absorbent layer by passing through the confinement layer, the confinement layer being substantially transparent to the laser beam. The confinement layer confines a laser induced plasma plume and creates a localized high-pressure condition for the photovoltaic absorbent layer. The laser beam can be pulsed to create localized rapid heating and cooling of the photovoltaic absorbent layer. The laser beam can be scanned across a specific region of the thin film structure. The system can also include an X-Y stage for scanning the target relative to the laser beam. The system can also include a movable mirror for scanning the laser beam across the thin film structure. The laser can be a neodymium-doped yttrium aluminum garnet (Nd:YAG) laser.

The photovoltaic absorbent layer can be made of various materials including copper indium diselenide, gallium arsenide, and cadmium telluride. The photovoltaic absorbent layer can be sandwiched between a substrate and a confinement layer, where the confinement layer is substantially transparent to the laser beam. The thin film structure can also include a molybdenum layer between the substrate and the photovoltaic absorbent layer. The confinement layer can be made of glass.

BRIEF DESCRIPTION OF THE DRAWINGS

FIGS. 3A and 3B show magnified views of a $CuInS_2$ thin film before and after high speed laser crystallization;

DESCRIPTION OF EXEMPLARY EMBODIMENTS

Figure 1:
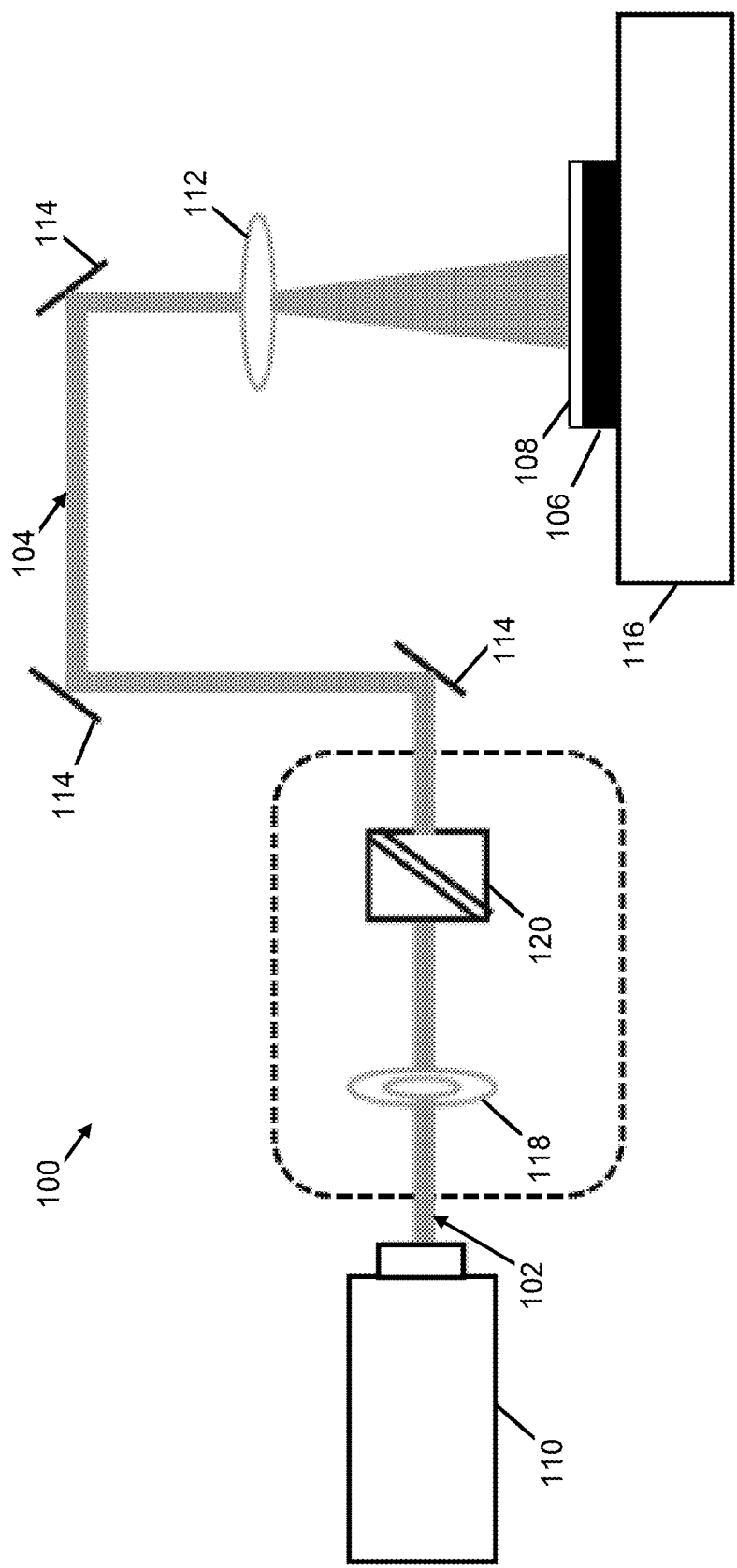
FIG. 1 illustrates an exemplary embodiment of a system that can be used for high speed laser crystallization.

For the purposes of promoting an understanding of the principles of the novel technology, reference will now be made to the exemplary embodiments described herein and illustrated in the drawings and specific language will be used to describe the same. It will nevertheless be understood that no limitation of the scope of the novel technology is thereby intended, such alterations and further modifications in the illustrated devices and methods, and such further applications of the principles of the novel technology as illustrated therein being contemplated as would normally occur to one skilled in the art to which the novel technology relates.

The high speed laser crystallization (HSLC) method uses a pulsed laser to crystallize thin films under a transparent confinement layer. This can provide several benefits over traditional methods, some of these benefits can include: 1) selectivity: the wavelength of the laser can be tuned to just heat the desired materials and not affect other layers, particularly if the laser scans only the region of interest, 2) fast processing time: using a beam mirror, the scanning speed can reach 10 m/s or more, 3) rapid heating and cooling rate to enable the formation of larger crystals, 4) no requirement for a vacuum/inert gas environment, 5) energy saving process due to the selective and fast production, and 6) more compacted crystals in the high speed laser crystallization.

This HSLC method can utilize a laser beam expander and a laser beam scanner to achieve high speed processing. During this HSLC process, the laser pulses create a localized rapid heating and cooling condition, which is advantageous for rapid growth of nanoscale crystals into large crystals, as well as for decreasing defects such as grain boundaries. To confine laser induced plasma plume and to create a localized high-pressure condition, a transparent confinement layer can be used. The induced high pressure forces the crystal to form a more compacted structure. The confinement layer also reduces the oxidization, which makes vacuum systems unnecessary for the HSLC method. As compared to conventional rapid thermal annealing (RTA), HSLC is fast, low cost, clean, and energy-saving, particularly as it avoids temperature controlling systems and sophisticated vacuum systems. HSLC is also able to selectively process a desired layer of materials without introducing damage to other solar cell materials. The HSLC methods can be used with a variety of thin film PV materials, for example copper indium diselenide (CuInSe$_2$), gallium arsenide (GaAs), cadmium telluride (CdTe), and related materials.

FIG. 1 illustrates an exemplary embodiment of a laser beam system 100 that can be used for high speed laser crystallization (HSLC). The laser beam system 100 directs a laser beam 102 along an optical path 104 to impinge upon a target 106. The target 106 is covered by a confinement layer 108 that is transparent to the laser beam 102. The laser beam system 100 includes a laser 110 that generates the laser beam 102 and a beam expander 112 that expands the laser beam 102 before it impinges on the target 106. The laser beam system 100 can also include one or more optical elements, for example mirrors 114, that direct the laser beam 102 along the optical path 104 from the laser 110 to the target 106. The laser beam system 100 can also include additional optical elements for focusing and attenuating the laser beam 102, for example an aperture 118 or a power attenuator 120.

The laser 110 can be a neodymium-doped yttrium aluminum garnet (Nd:YAG) laser which can generate laser beams having wavelengths of 1064 nm, 532 nm or 355 nm using methods such as second harmonic generation or frequency doubling. The target 106 can be placed on an X-Y stage 116 that can move the target 106 as desired. The laser beam system 100 can provide rapid short duration pulses (for example, 5 nsec pulses) and/or can perform high speed laser scanning of the target 106, for example 10 m/s, by using a high speed laser beam scanner. The scanning can be performed by movement of the laser beam 102 or movement of the target 106, or both.

Figure 2:
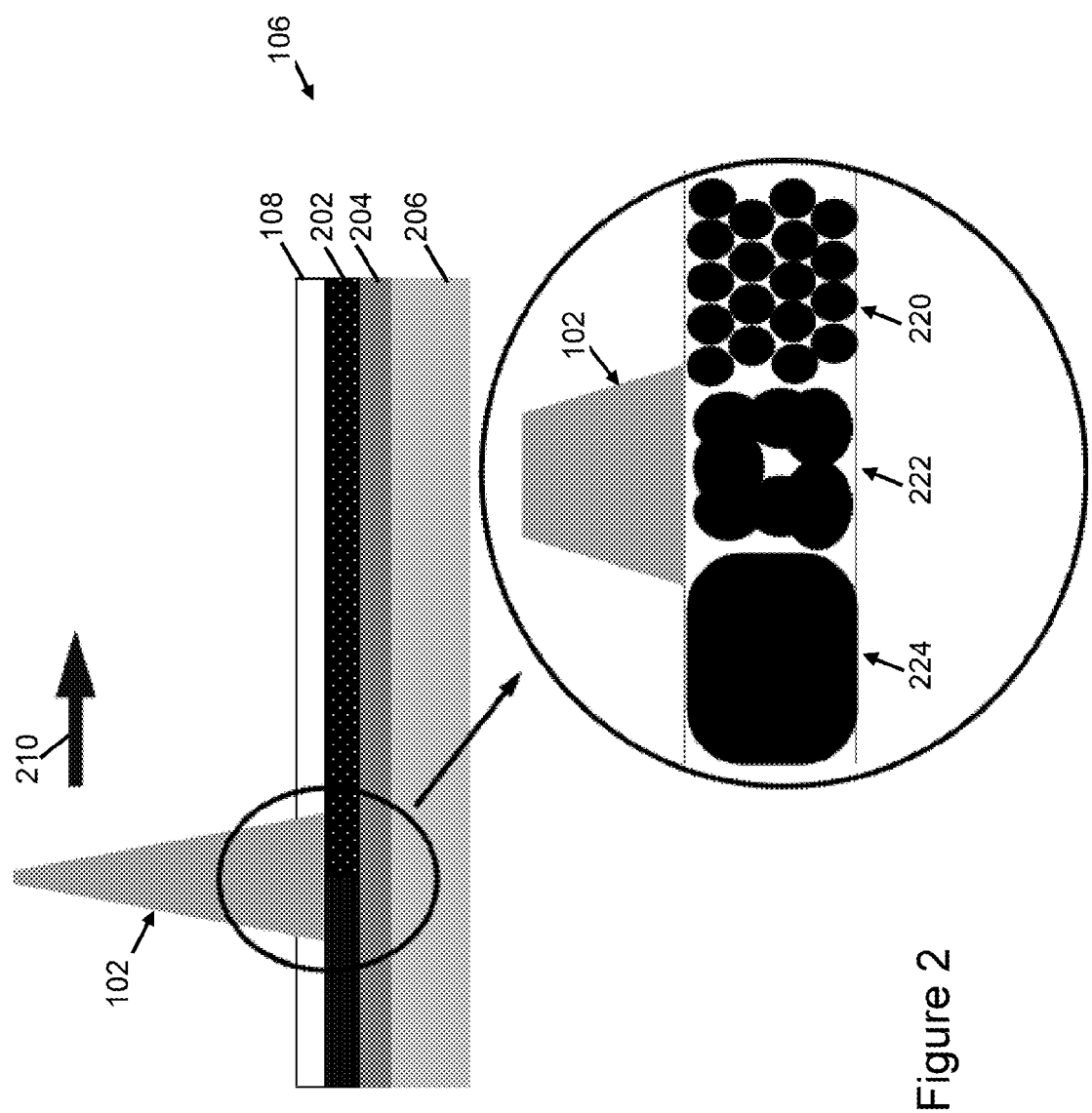
FIG. 2 is an enlarged view of the laser beam impinging on the target of the system in FIG. 1 and illustrates the process of high speed laser crystallization.

FIG. 2 is an enlarged view of the laser beam 102 impinging on the target 106 and illustrates the effect of high speed laser crystallization. The target 106 includes a substrate 206 coated with a molybdenum layer (Mo-coating) 204 that is coated with a PV absorbent layer 202 that is covered by the transparent confinement layer 108. The transparent confinement layer 108 can be made of glass.

The laser beam 102 is directed along the optical path 104 from the laser 110 to the target 106. The laser beam 102 passes through the transparent confinement layer 108 and strikes the PV absorbent layer 202. The PV absorbent layer 202 absorbs most of the laser energy which creates a high-temperature and high-pressure region between the substrate 206 and the confinement layer 108 which causes the PV absorbent layer 202 to become more dense and smooth and to form larger crystals.

The blow-up portion of FIG. 2 provides a very simplified illustration of the changes in the PV absorbent layer 202 as the laser beam 102 passes over it in the direction of the arrow 210. On the right side of the blow-up portion in region 220, the laser beam 102 has not hit the PV absorbent layer 202 and the PV absorbent layer 202 comprises a plurality of tightly packed crystals 220. In the middle of the blow-up portion in region 222, the laser beam 102 is starting to hit the PV absorbent layer 202 and the PV absorbent layer 202 comprises densified, larger crystals with fewer gaps 222. On the left side of the blow-up portion in region 224, the laser beam 102 has hit the PV absorbent layer 202 for a longer duration and the PV absorbent layer 202 comprises larger crystals with significantly fewer gaps 224. When the laser beam passes over the entire PV absorbent layer 202, then all of the PV absorbent layer 202 will be in the larger crystal state of region 224.

The disclosed pulsed laser crystallization process can grow solar cell nanocrystals into larger sizes (i.e., ultra-large crystals). The HSLC techniques can process selective materials at selective locations without damaging other components. These benefits can be achieved with relatively small start-up costs and do not require careful temperature control systems. The disclosed HSLC technique is a rapid approach that is achieved by delivering multiple laser pulses in rapid succession (e.g. 30 pulses of 5 ns each) to a target. The crystal growth and densification are completed almost instantaneously after the pulses. The HSLC process does not require high temperature and vacuum environments since it can be carried out at room temperature and atmospheric pressure. These benefits allow the system to achieve substantial energy and setup savings. HSLC processing can also be used with other photovoltaic materials, such as CdTe, GaAs, silicon, etc.

FIG. 3A shows two views of a $CuInS_2$ thin film before high speed laser crystallization at magnification levels of 10.0 μm and 500 nm, respectively. FIG. 3B shows two views of the thin film of FIG. 3A after high speed laser crystallization at magnification levels of 10.0 μm and 1.0 μm, respectively. The densification and formation of larger crystals due to high speed laser crystallization can be seen in these images.

Figure 4B:
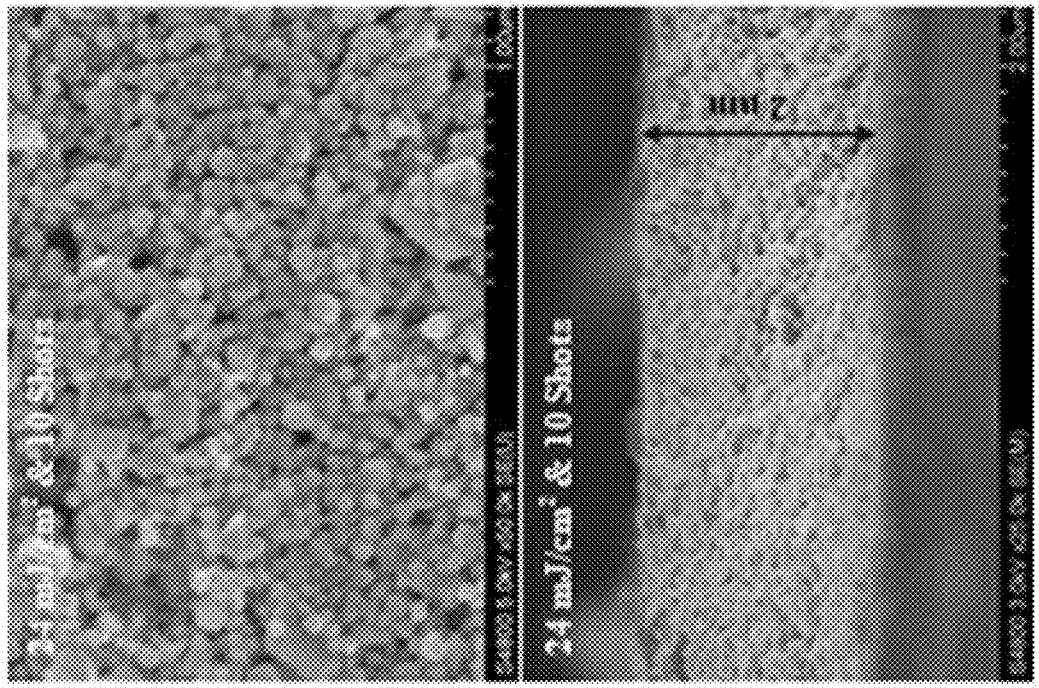
FIGS. 4A-E show the progression of changes in a $CuInSe_2$ thin film during high speed laser crystallization.
Figure 4A:
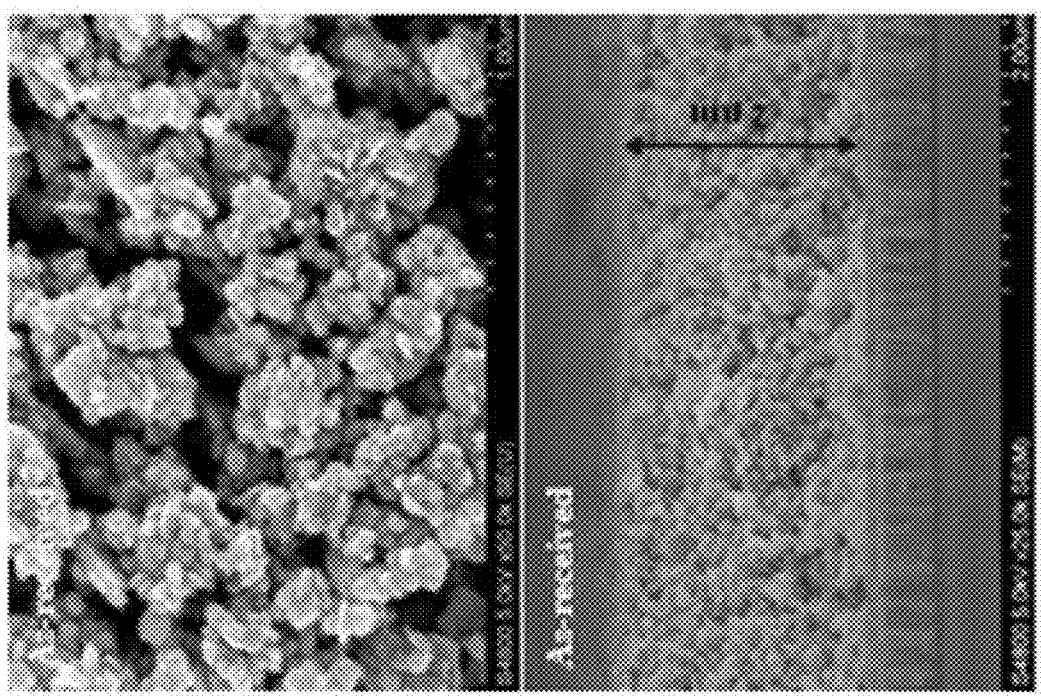
Figure 4D:
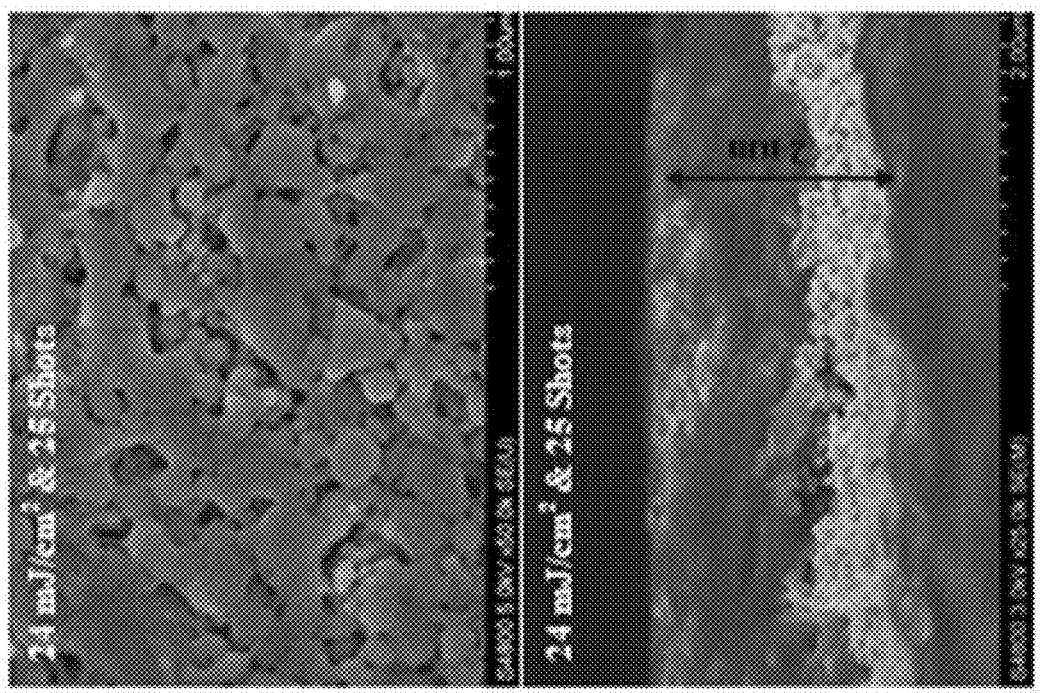
Figure 4C:
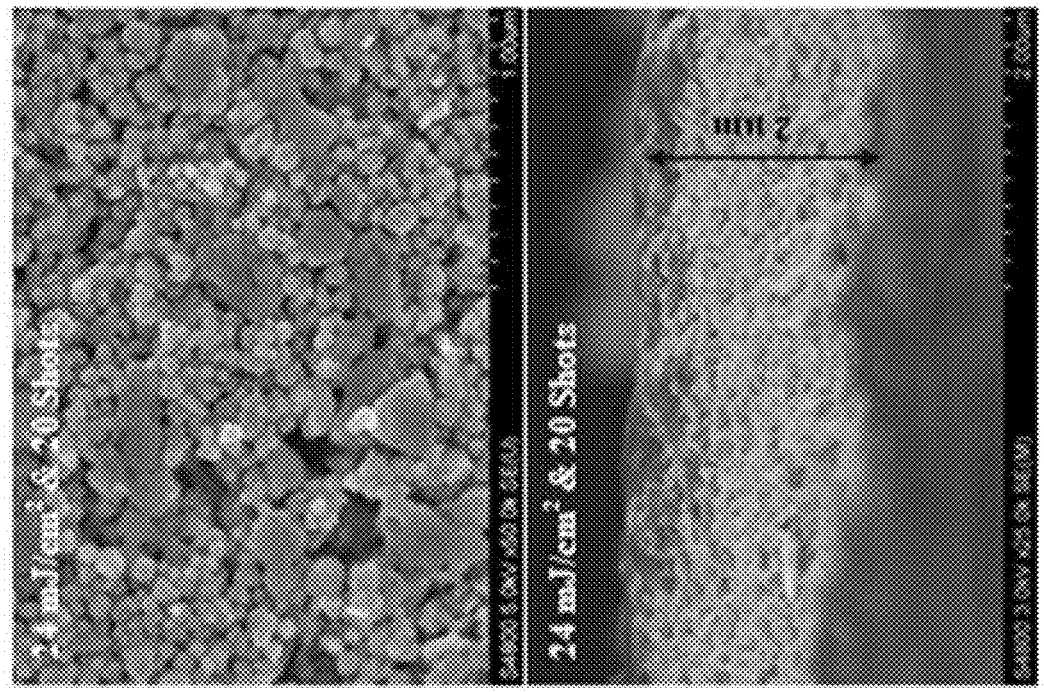
Figure 4E:
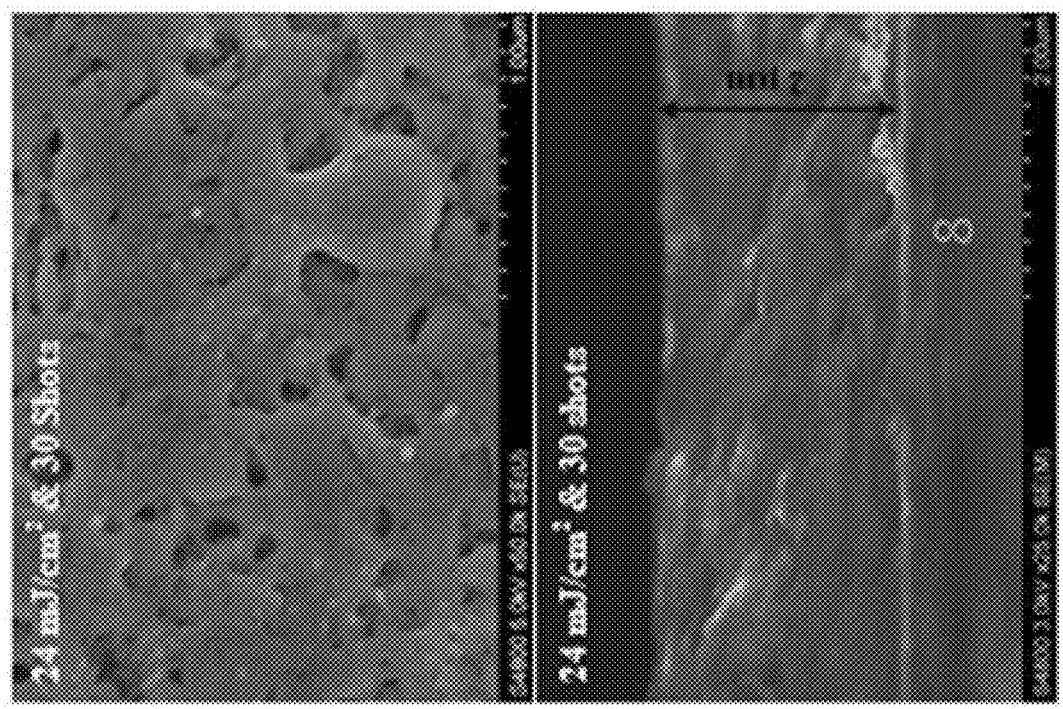

FIGS. 4A-E show the progression of changes in a $CuInSe_2$ thin film during high speed laser crystallization. Each of FIGS. 4A-E includes a top view and a side view of the $CuInSe_2$ thin film at magnification levels of 2.0 μm and 1.0 μm, respectively. FIG. 4A shows top and side views of the $CuInSe_2$ thin film before high speed laser crystallization. FIG. 4B shows top and side views of the $CuInSe_2$ thin film after 10 laser pulses during high speed laser crystallization. After 10 pulses (FIG. 4B), smoothed and densified nanocrystals can be seen on the top surface. FIG. 4C shows top and side views of the $CuInSe_2$ thin film after 20 laser pulses during high speed laser crystallization. FIG. 4D shows top and side views of the $CuInSe_2$ thin film after 25 laser pulses during high speed laser crystallization. After 20-25 pulses (FIGS. 4C and 4D), top layer nanocrystals are growing into larger submicron sizes. FIG. 4E shows top and side views of the $CuInSe_2$ thin film after 30 laser pulses during high speed laser crystallization. After 30 pulses (FIG. 4E), all nanocrystals appear to be growing together and $CuInSe_2$ crystals over 1 μm were formed. After 30 pulses, the density of grain boundaries and crystal-crystal gaps were significantly decreased.

The fast growth of nanocrystals from 25 to 30 shots is attributed to rapid heat conduction when the crystals grew large. The smaller gaps among crystals and less density of grain boundaries increases the free movement of electrons generated in the absorber layer, which potentially increases the electron conductions thus increasing the conversion efficiency of solar cells.

Figure 5B:
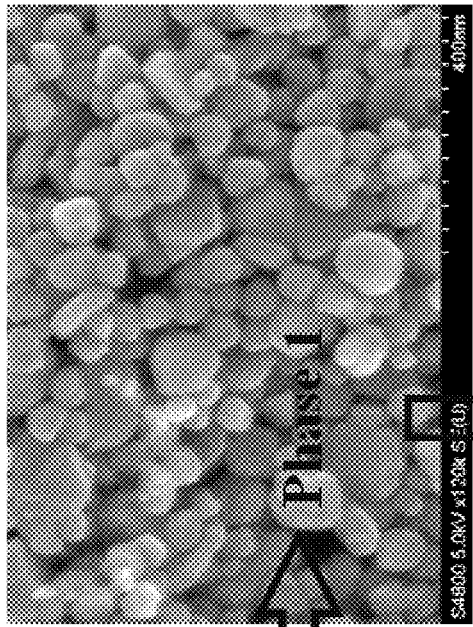
FIGS. 5A-D illustrate the mechanisms of crystal growth through three phases.
Figure 5C:
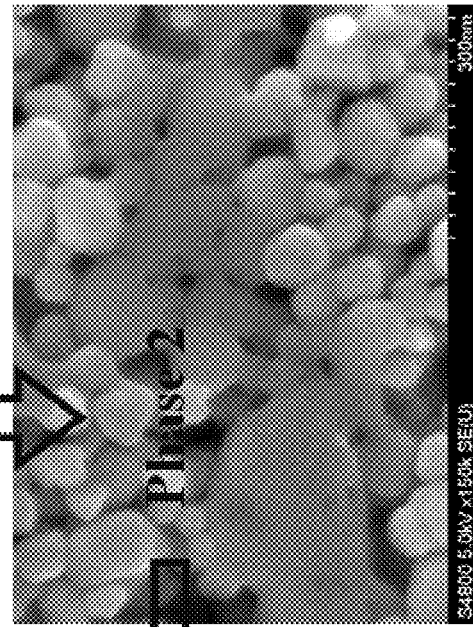
Figure 5A:
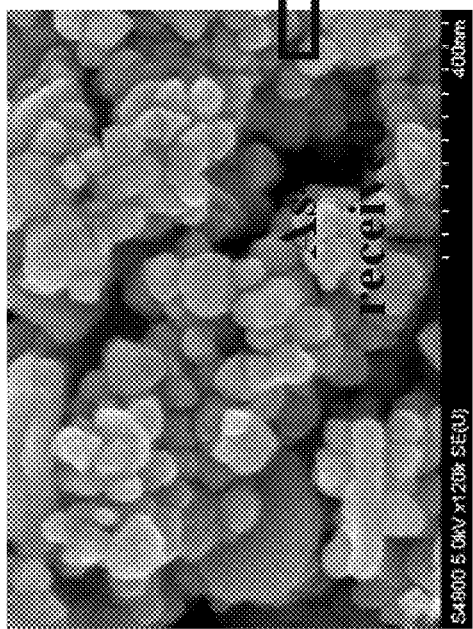
Figure 5D:
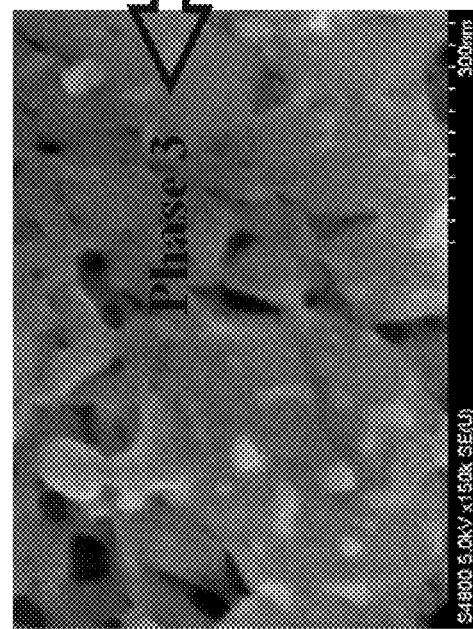

FIGS. 5A-D illustrate the mechanisms of crystal growth for a $CuInSe_2$ thin film. FIG. 5A, at a magnification of 400 nm, shows the thin film before high speed laser crystallization. FIG. 5B, at a magnification of 400 nm, shows a first phase where a densification of isolated nanocrystals occurs due to a smoothening effect caused by the high pressure generated between the confinement layer and the CIS layer. The confinement layer also helps to reduce oxidization. FIG. 5C, at a magnification of 300 nm, shows a second phase where crystal growth occurs after overcoming the surface and strain energy; neighboring crystals join together to form larger sub-micron crystals. FIG. 5C, at a magnification of 300 nm, shows a third phase where submicron scale crystals merge with neighboring crystals to form microscale crystals as more energy is provided through the HSLC process to overcome surface energy.

Figure 6B:
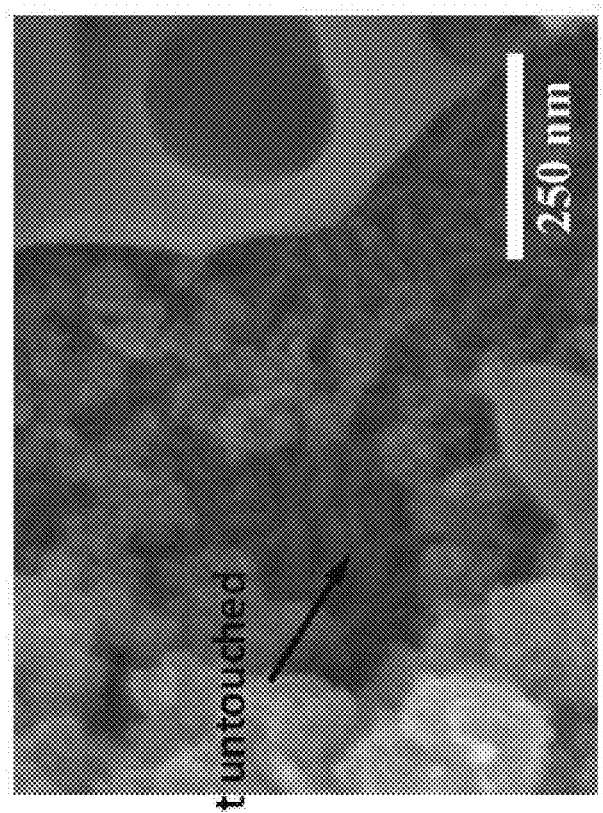
FIGS. 6A and 6B illustrate that the molybdenum layer of a target survives the high speed laser crystallization process.
Figure 6A:
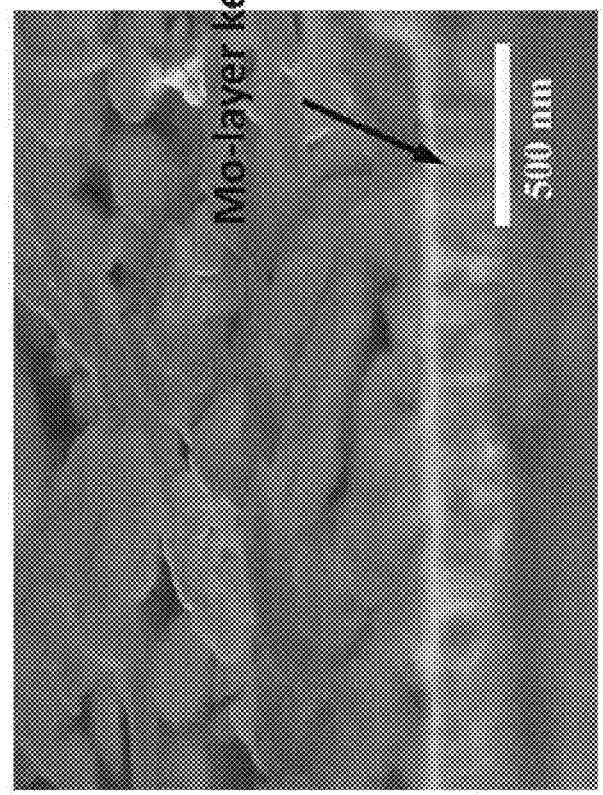
Figure 7B:
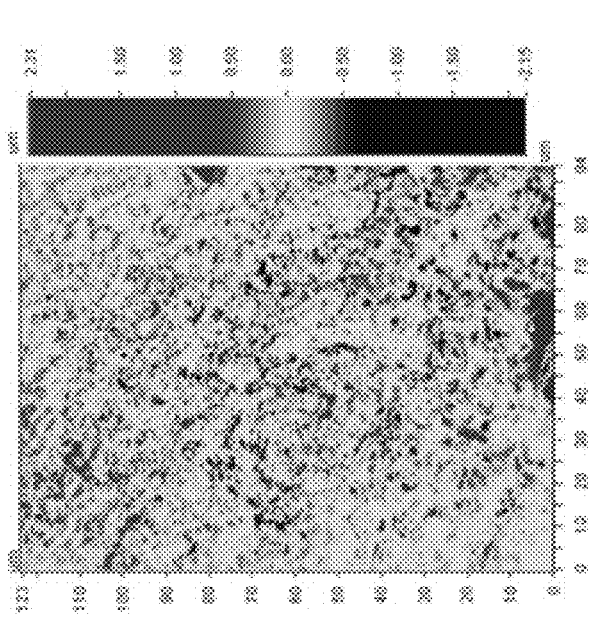
FIGS. 7A and 7B show the smoothing effect that was observed when the surface was examined by optical profilometry before and after high speed laser crystallization.
Figure 7B:
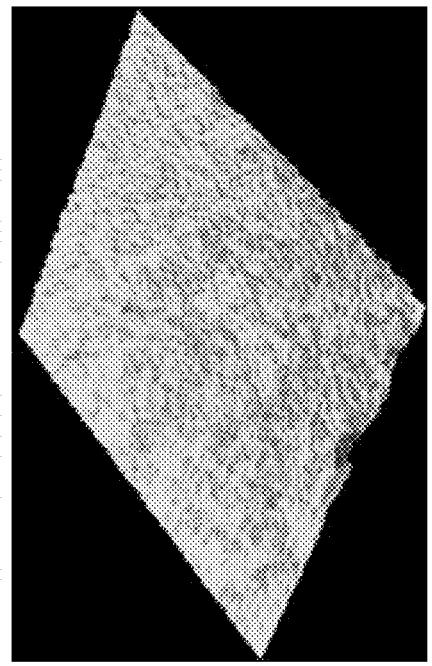
Figure 7A:
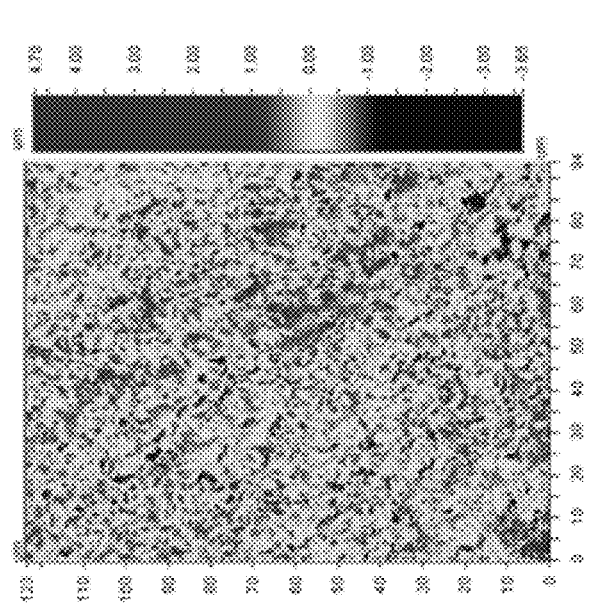
Figure 7A:
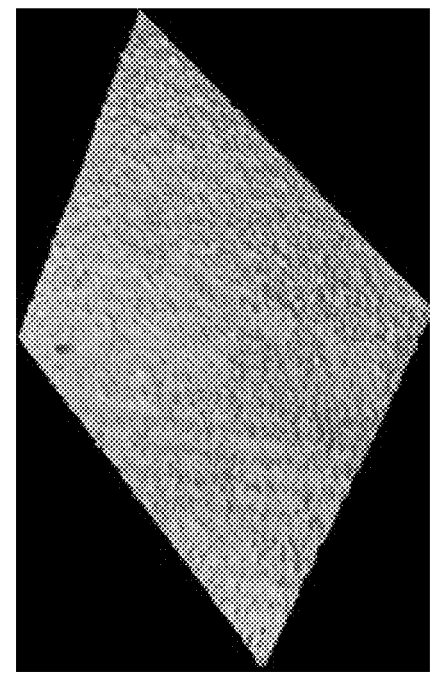

FIGS. 6A and 6B illustrate that the molybdenum layer (mo-coating) 202 survives the HSLC process with proper process parameters. FIG. 6A shows the mo-coating remained largely unchanged when $CuInSe_2$ and/or $CuInS_2$ nanocrystals were grown large. The mo-layer 202 does not interact with applied laser beam directly. The laser induced high temperature and pressure are absorbed by the PV absorbent layer 204, with a relatively small amount of leftover heat energy conducted down to the mo-layer 202, which would not damage the mo-coating 202.

FIG. 7 shows the smoothing effect that was observed when the surface was examined by optical profilometry after high speed laser crystallization. Before HSLC treatment (FIG. 7A), the surface roughness values $R_a$ and $R_b$ were measured to be 347 nm and 437 nm, respectively. After high speed laser crystallization (FIG. 7B), the surface roughness values $R_a$ and $R_b$ were reduced to 181 nm and 251 nm, respectively.

Figures 8A, 8B:
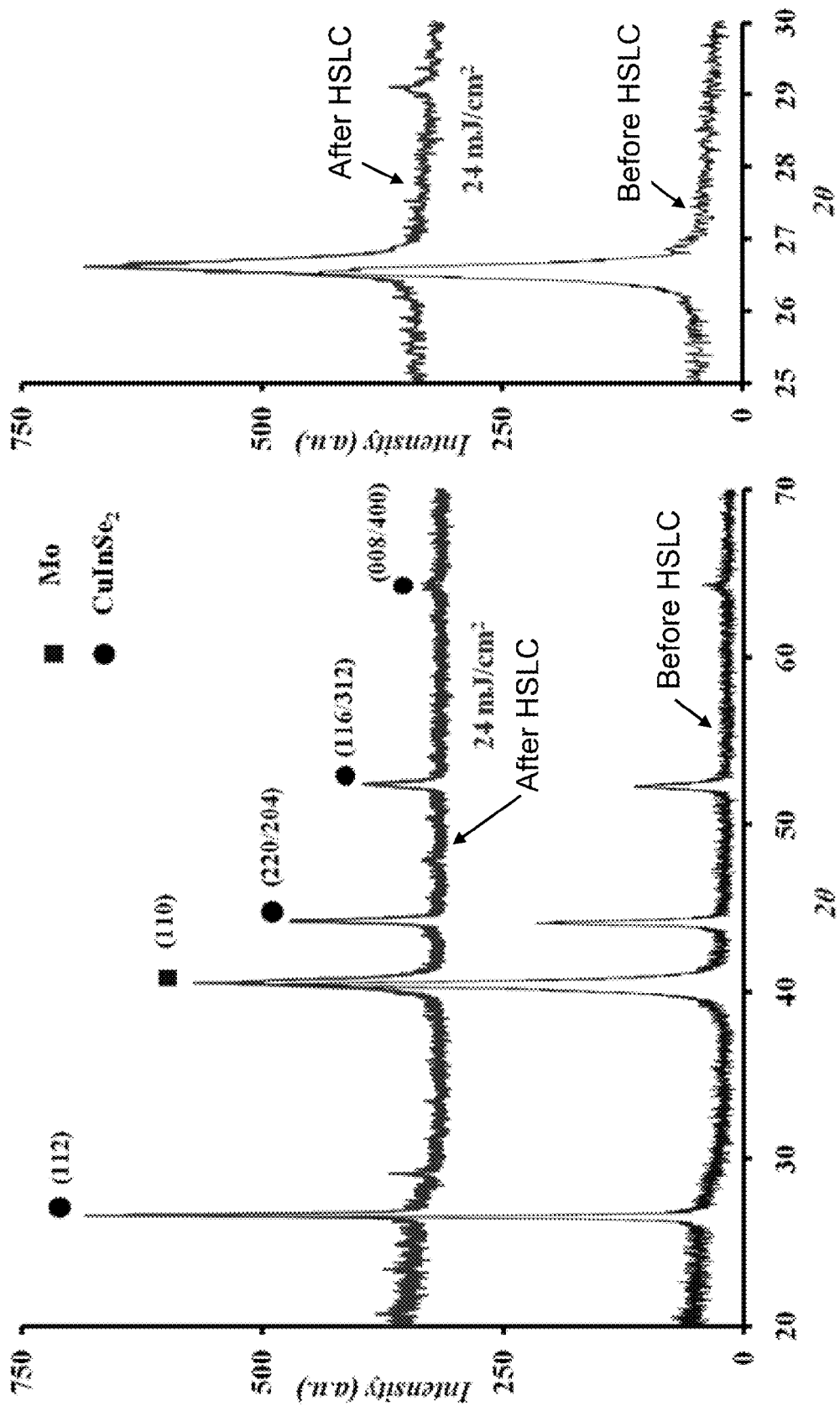
FIG. 8A shows an X-ray diffraction (XRD) structural analysis of a CuInSe$_2$-based solar cell unit before and after high speed laser crystallization treatment.
FIG. 8B is an expanded view of the (112) peak of FIG. 8A showing the peak shift due to high speed laser crystallization processing.

FIG. 8A shows an X-ray diffraction (XRD) structural analysis of a $CuInSe_2$-based solar cell unit before and after HSLC treatment. The HSLC treatment caused the intensity to increase across the spectrum. FIG. 8B is an expanded view of the (112) peak which shows the peak shift due to HSLC processing.

Figures 9A, 9B:
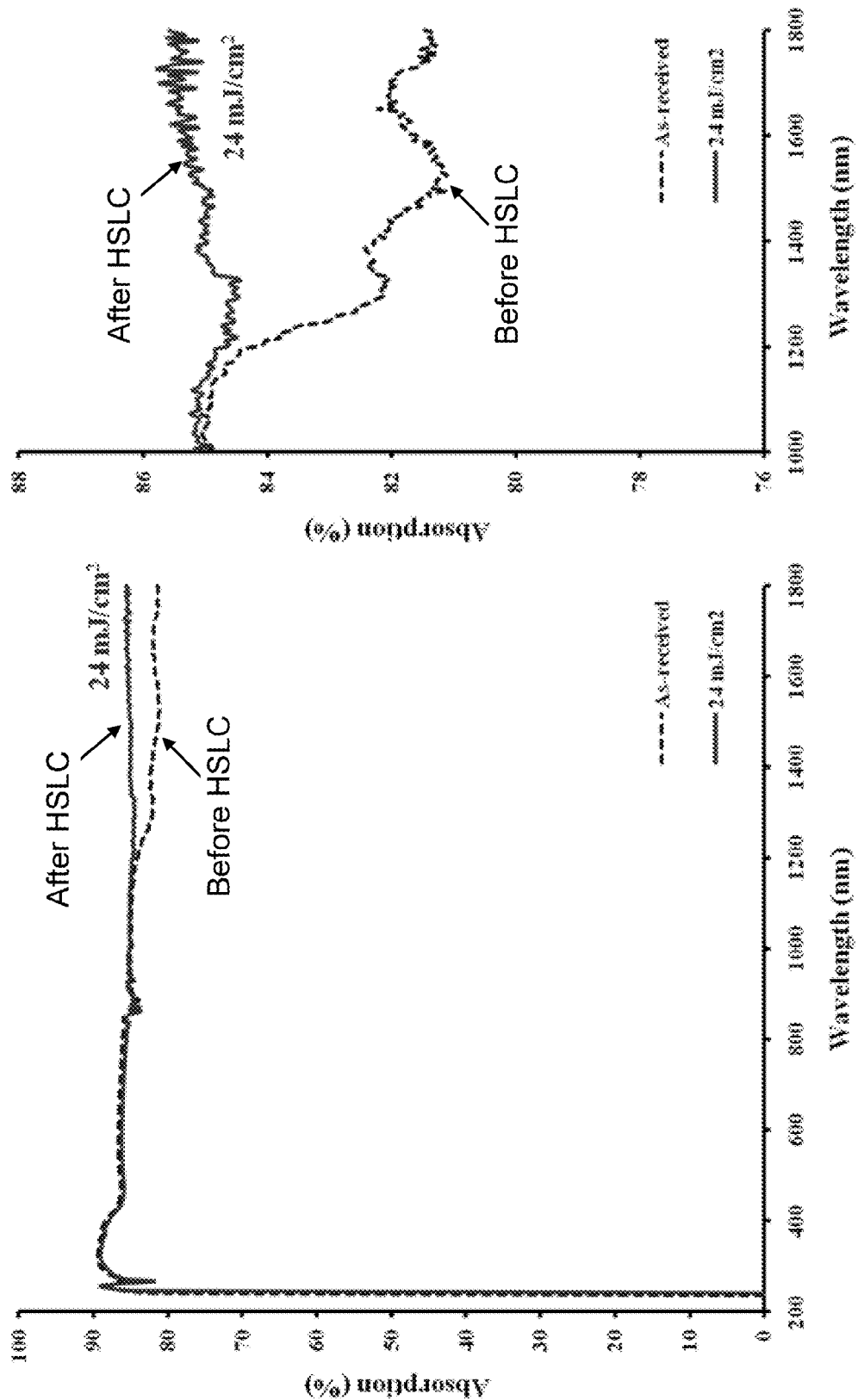
FIG. 9A shows the absorption spectrum across the ultraviolet (UV) through near-infrared (NIR) spectrum of a CuInSe$_2$-based solar cell unit before and after high speed laser crystallization treatment.
FIG. 9B is an expanded view of the NIR region which shows an average of 3.3% enhancement in absorption efficiency.

FIG. 9A shows the absorption spectrum across the ultraviolet (UV) through near-infrared (NIR) spectrum of a $CuInSe_2$-based solar cell unit before and after HSLC treatment. It can be seen that the HSLC treatment causes absorption to increase, especially in the NIR region. FIG. 9B is an expanded view of the NIR region which shows an average of 3.3% enhancement in absorption efficiency.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains.

What is claimed is:

1. A method for enhancing the conversion efficiency of thin film photovoltaics, the method comprising:
   obtaining a thin film structure including a photovoltaic absorbent layer;
   transmitting a laser beam along an optical path to hit the photovoltaic absorbent layer of the thin film structure;
   pulsing the laser beam to create a localized rapid heating and cooling of the photovoltaic absorbent layer; and
   transparently confining the photovoltaic absorbent layer to confine a laser induced plasma plume and create a localized high-pressure condition for the photovoltaic absorbent layer.

2. The method of claim 1, wherein the photovoltaic absorbent layer is selected from at least one of copper indium diselenide, gallium arsenide, and cadmium telluride.

3. The method of claim 1, wherein the thin film structure comprises the photovoltaic absorbent layer sandwiched between a substrate and a confinement layer, the confinement layer being substantially transparent to the laser beam.

4. The method of claim 3, wherein the thin film structure further comprises a molybdenum layer between the substrate and the photovoltaic absorbent layer.

5. The method of claim 3, wherein the confinement layer is made of glass.

6. The method of claim 1, further comprising scanning the laser beam across a specific region of the thin film structure.

7. The method of claim 6, wherein the scanning comprises moving the thin film structure using an X-Y stage.

8. The method of claim 6, wherein the scanning comprises using a movable mirror to scan the laser beam across the thin film structure.

9. The method of claim 1, wherein the pulsing comprises generating a series of laser beam pulses having a duration of approximately 5 nanoseconds.

10. The method of claim 9, wherein the series of laser beam pulses comprises at least 20 pulses.

* * * * *